Aug. 10, 1965 J. H. BRUESTLE 3,200,296

COMBINED MOUNTING-BRACKET AND HEAT-SINK

Filed Oct. 26, 1962

2 Sheets-Sheet 1

INVENTOR.
JOHN H. BRUESTLE

BY Eugene M. Whitacre

ATTORNEY

COMBINED MOUNTING-BRACKET AND HEAT-SINK

Filed Oct. 26, 1962 2 Sheets-Sheet 2

INVENTOR.
JOHN H. BRUESTLE
BY
Eugene M. Whitacre
ATTORNEY

United States Patent Office 3,200,296

Patented Aug. 10, 1965

3,200,296

COMBINED MOUNTING-BRACKET AND HEAT-SINK

John H. Bruestle, Metuchen, N.J., assignor to Radio Corporation of America, a corporation of Delaware Filed Oct. 26, 1962, Ser. No. 233,328

12 Claims. (Cl. 317—100)

The present invention relates to a chassis structure for mounting circuit components in electrical and electronic apparatus. More particularly, the present invention relates to chassis structures for mounting transistors and like heat-sensitive devices and components in apparatus of the type referred to.

As is known, transistors and like heat-sensitive electrical and electronic circuit components are also heat-generating and, for effective operation, heat-dissipating means must often be provided in connection therewith. Heat-dissipating attachments for such devices or components have heretofore been provided in various forms, including cooling fins and like heat-dissipating means. In some cases integral heat-dissipating means are provided for such devices or components. Heat-dissipating means as heretofore provided may thus be complicated in use and construction, and necessarily add to the cost of the associated apparatus or equipment.

It is therefore an object of this invention, to provide an improved heat-dissipating chassis structure for mounting transistors and like heat-sensitive devices which obviates the above and other disadvantages of know structures of this type.

It is also an object of this invention to provide an improved mounting and heat-sink means for heat-sensitive circuit components in electrical and electronic apparatus and equipment.

It is also a further object of this invention to provide an improved chassis structure for mounting transistors and like heat-sensitive devices which (1) releasably holds each device or transistor in a fixed position and location as structural mounting means therefor, (2) efficiently absorbs and dissipates heat from each device or transistor as a heat-sink means therefor, and (3) makes effective thermal and, if desired, electrical contact with each device or transistor through mechanical gripping or clamping action on the casing or outer wall thereof.

In accordance with one form of the invention, a combined mounting-bracket or plate and heat-sink means is provided with a slotted hole or opening therethrough shaped for receiving and releasably gripping the outer wall or casing of a transistor or like heat-sensitive device. Means are provided for applying pressure along an axis of the mounting means or bracket at substantially a right angle to the slot, thereby tending to close the slot and grip the device in the opening with good thermal and electrical contact. Electrical contact may be prevented in certain cases by anodizing or like processes without loss of heat conduction.

The means for applying the pressure along the axis referred to may include two spaced support elements acting on or connected with one edge or side of the mounting-bracket and heat-sink means to apply a supporting pressure thereto, and a third element acting on or connected with said edge or side, intermediate between said two support elements, to apply pressure or stress in opposition thereto.

Viewed in another of its aspects, a combined mounting-bracket or plate and heat-sink in accordance with the invention, may include a split or slotted plate or panel having a flexible flange or other footing or supporting means connected along one fixed edge or unitary therewith, and with one or more openings in the plate or panel, each substantially bisected or divided by a relatively-narrow slot extending from another edge, such as the opposite or free edge. The opening or openings are each shaped to receive a heat-generating electronic device or apparatus component, such as a transistor, with a tight clamping fit for good thermal conduction from said device to said plate as a heat sink. Further means connected with and including the flange or footing means are provided for applying a deforming pressure to the plate in the plane thereof and in a direction tending to close the slot and increase the clamping pressure on the device or devices in the opening or openings.

The combined mounting-bracket and heat-sink means may thus include a mounting plate or blade with one or more relatively-narrow slots extending from one free edge toward, and at substantially a right angle to, an opposite fixed edge to which pressure in the plane of the plate is applied at spaced points to close the gap in the slot and clamp each device in an opening divided or bisected by the slot. Thus means may be connected with the fixed edge at spaced points therealong for applying a deforming pressure to the mounting plate in the plane thereof, tending to close the slot or slots and to produce an increased clamping pressure on the device or devices in the opening or openings, and thereby establish a close thermal (and electrical) contact with the outer surface or casing of each device.

The invention will further be understood from the following description of certain embodiments thereof, when considered with reference to the accompanying drawings, and its scope is pointed out in the appended claims.

Figure 1:
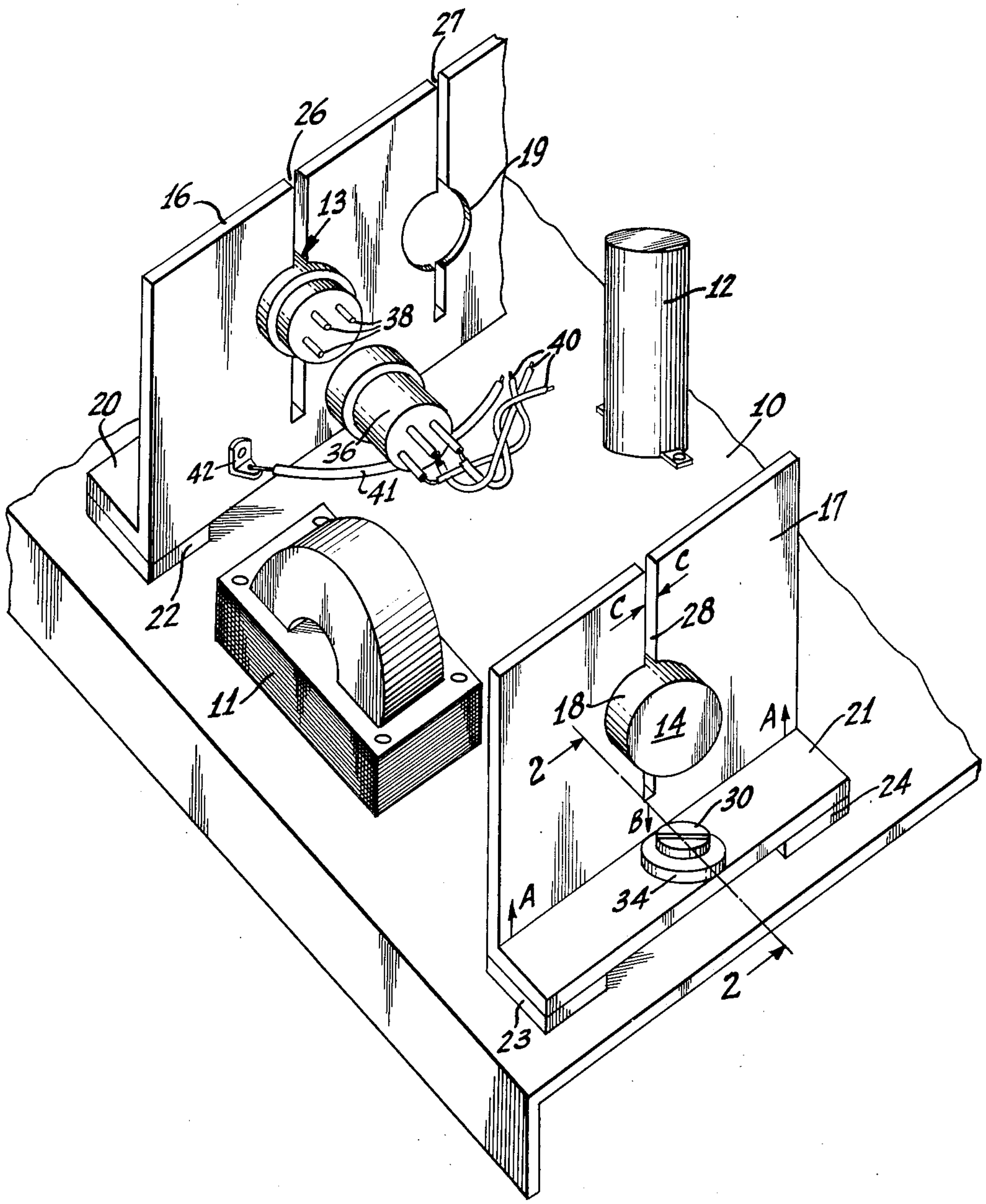
FIGURE 1 is an end view in perspective, of an electronic apparatus chassis provided with chassis structure for mounting transistor and the like heat-sensitive devices in accordance with the invention.

Referring to the drawings, wherein like parts are designated by like reference numerals throughout the various figures, and referring more particualrly to FIGURE 1, an electronic apparatus chassis 10 is provided with electronic circuit components indicated by a transformer 11 and a capacitor element 12, together with two electronic devices or transistors 13 and 14. Other circuit components normally provided on the chassis, are omitted from the drawing to provide a clarified showing of the transistor mounting structures or means to which the invention relates more particularly. The apparatus shown may be taken as representative of any electronic equipment having heat-sensitive components or devices, such as the transistors 13 and 14 for mounting thereon.

Each of the transistors is mounted in a split or slotted plate or panel, the plate 16 being provided for the transistor 13 and the plate 17 being provided for the transistor 14. Each of the plates is provided with a hole or opening 18 as shown more clearly in the plate 17, shaped for receiving the transistor with a smooth fit and having inner edges or surfaces adapted for engaging the outer wall or casing of each transistor. Thus with cylindrical transistor casings as shown, the openings are likewise cylindrical in form. The exact form of the opening is also shown fully by the additional hole or opening 19 in the plate 16, for an additional transistor (not shown). Thus more than one electronic device or transistor may be mounted in a plate by spacing the openings sufficiently to provide proper clearance and cooling area between the transistors.

The plates are secured to the chassis 10 each along one edge, which is the lower edge in the present example, and stand in vertical positions, or at a right angle to the chassis surface, in spaced parallel relation as indicated. Each of the plates is also provided, along the fixed edge, with suitable mounting means such as a relatively short or narrow flange 20 on the plate 16 and a similar flange 21 on the plate 17, the flanges extending substantially at a right angle to the plates, as indicated. At each end of the plates, the flange is spaced from the chassis surface by suitable means, such as blocks or strips of electrical and thermal insulating material, as indicated at 22 for the plate 16 and at 23 and 24 for the plate 17.

Each of the transistor openings in the mounting plates are divided, and in the present example bisected, by a relatively narrow slot extending from the opposite or free edge of the plate toward the fixed edge and passing through the opening, in each case, to a point spaced from or short of the fixed edge, as shown by the slots 26 and 27 in the plate 16 and the slot 28 in the plate 17.

Figure 2:
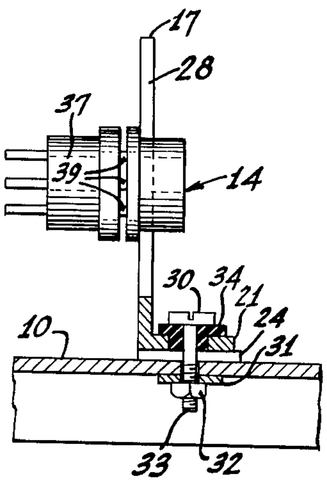
FIGURE 2 is a cross-sectional side view, in elevation, of a portion of a chassis structure of FIGURE 1, taken on the section line 2—2 and showing further details thereof.

Referring now to FIGURE 2 along with FIGURE 1, the operation of the plates or panels as mounting means for the transistors will be described with reference to the panel 17, it being understood that the description applies to both plates or panels. It will be seen that the transistor 14, seated in the opening 18, is detachably removable from the opening and may be retained or clamped in place by applying pressure along a transverse axis of the plate 17, as indicated by the arrowed lines C—C, tending to close the slot 28 and bring a gripping or clamping pressure to bear upon the transistor outer walls by the inner surfaces of the opening 18, moving in the direction of the arrowed lines referred to.

The clamping pressure is applied by providing a force acting in the plane of the plate, intermediate between the ends thereof, as indicated by the arrowed line B. This force is in direct opposition to the force applied to the plate at its fixed edge by the supporting means including the flange 21 and insulating strips 23 and 24 in contact with the chassis 10, and is directed in the plane of the plate as indicated by the arrowed lines A—A. The clamping force supplied along the arrowed line B may be provided by any suitable means connected with the fixed edge of the plate or panel intermediate between the spaced support points indicated by the arrowed lines A—A.

In the present example, the pressure is provided by a clamping screw 30 which passes through the flange 21 and through the chassis web as shown more clearly in FIGURE 2. The clamping screw is provided with a suitable washer 31 and clamping nut 32 for the threaded end thereof. In the present example, the screw is insulated from the flange 21 by a suitable shouldered washer 34 as shown more clearly in FIGURE 2, although it may be connected directly with the flange in apparatus where the grounding of the mounted transistor or other device to the chassis is not of importance. In such cases, the spacing strips or blocks between the flange 21 and other footing elements of the mounting plates or panels may be of electrical conducting material.

It will be seen that as the clamping screw 30 is tightened, the downward pressure or stress along the axis B is increased and the plate 17 is subjected to a transverse deforming pressure along the axis C—C, tending to close the slot and producing a clamping pressure on the device or devices in the mounting openings. This pressure is increased to establish a close thermal and, if desired electrical contact with the outer surface of the device or transistor.

The clamping screw and its connection with the plate through the flange provides means for applying the deforming pressure to the plate in a direction tending to close the slot and thus quickly fix or mount the device in its operating position. It will be seen that the clamping screw also provides for a quick release of the device, and this feature is of use in testing equipment where transistors or like devices must be mounted and dismounted in succession, and thereby utilize more fully the quick clamping action of the mounting means shown.

For making electrical connections with the transistors or like devices in a chassis structure embodying the invention, it is desirable to provide a plug-in type of connection as indicated in FIGURES 1 and 2 by the plug-and-socket connectors 36 and 37 for the transistors 13 and 14, respectively. These are adapted to engage the terminals 38 and 39, respectively, of the transistors 13 and 14, and, in turn, are provided with input circuit connections indicated by the connection leads 40 for the connector 36. Likewise, a connection circuit lead 41 may be provided with a terminal 42 for either or both of the mounting plates, and as here indicated for the plate 16. This provides an electrical connection through the plate with the mounted transistor devices at the casings or outer walls thereof which may be internally connected with one of the electrodes, such as the collector.

Where two transistors are mounted in the same plate or panel, as provided for by the panel 16, both transistor casings may thus be connected in parallel relation electrically and with the connection lead 41 through the common terminal 42, in operation. However, either or both of the casings of the transistors in the present example may be suitably insulated electrically from the plate by interposing electrical insulating means, such as a non-conducting film or coating on the inner edges or surfaces of the mounting openings, which is at the same time fully heat conducting. Thus the mounting plate surfaces for this purpose may be suitably processed to provide desired electrical insulation without thermal insulation or impedance. Any good heat-conducting electrical insulating film may be provided for this purpose.

Figure 3:
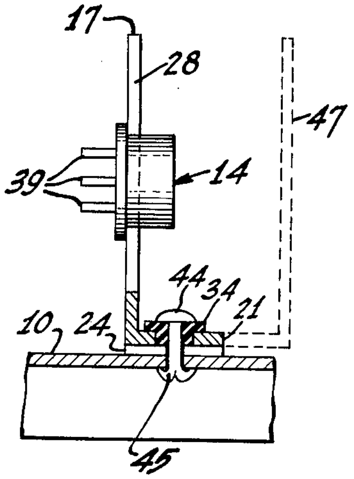
FIGURE 3 is a similar cross-sectional side view of the structures shown in FIGURE 2, illustrating a modification thereof.

The chassis construction shown thus provides a combined mounting bracket and heat-sink means in which transistors and like heat-sensitive electrical and electronic devices may quickly be mounted and clamped, and as quickly released, as in test equipment and the like. Where a permanent mount is desired, as in normal signal amplifier and like apparatus, the cost of the clamping means may be substantially reduced by eliminating the clamping screw construction and substituting a construction of the type shown in FIGURE 3, to which attention is now directed. This shows the use of a rivet or headed pin element 44 which may likewise be insulated from the plate or flange by the washer element 34, and expanded or heated over as indicated at 45 below the chassis web or plate 10. The construction shown in FIGURE 3 provides for rapidly mounting and clamping transistors or like elements in the plate or panel structures. The rivet through the central opening is longitudinally compressed to upset or expand the inserted end which may be hollow. This serves to apply a fixed clamping pressure at B in FIGURE 1, and thus lock the transistor in place.

Figure 4:
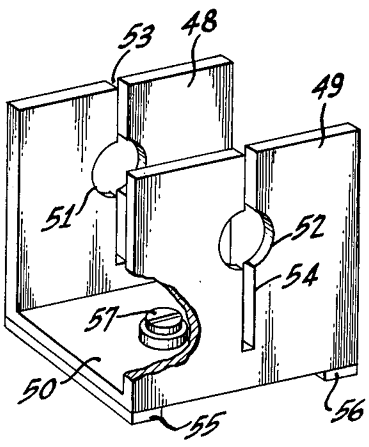
FIGURES 4 and 5 are end views in perspective, and on a reduced scale, of further modifications of the chassis structures of FIGURE 1.

As indicated by the dotted outline 47 in FIGURE 3, and as shown more fully in FIGURE 4 to which attention is now directed, two plate or panel elements 48 and 49, corresponding to the separate elements 16 and 17 of FIGURE 1, may be joined in one piece through a common flange or web element 50 between them. The mounting openings 51 and 52, and corresponding transverse dividing slots 53 and 54, are otherwise the same as in the preceding embodiment and for the same purpose. The double plate construction may be mounted on suitable end supports or spacing means, such as insulating strips or blocks 55 and 56, to permit deformation of both plates by the application of pressure to the web 50 intermediate between the supports through common clamping means 57 of the type previously described, and resulting in the same operation as previously described for the single units of FIGURES 1, 2 and 3. In this case, one of the transistors or other circuit devices mounted in the common electrically-conductive structure may be insulated by anodizing or other means, as hereinbefore referred to, which provides good heat conduction.

Figure 5:
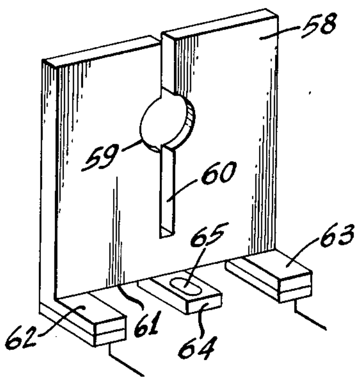

Referring to FIGURE 5, a slotted mounting plate or panel 58, similar to the preceding examples and comprising a mounting opening 59 and dividing slot 60, may be provided at its fixed edge 61 with footing means or integral bracket elements 62 and 63 at either end, and with an intermediate bracket element 64 for applying the clamping pressure in opposition to the supporting pressure provided by the bracket elements 62 and 63, in place of flange in the preceding examples. The center element 64 is provided with a suitable opening 65 for receiving the clamping means which may be a clamping screw, a set rivet element or the like, depending upon the construction and use of the apparatus for which it is provided.

The bracket elements 62, 63, and 64, as well as the flanges 20 and 21 of the preceding examples, and the spacing means therefor, represent any suitable means for applying, at spaced points along the fixed edge, a deforming pressure to the plate in the plane thereof, tending to close the slot and clamp the device in the opening for establishing the close thermal (and electrical) contact desired. The bracket or flange elements provide means along the fixed edge for applying the supporting and clamping pressures indicated at A—A and B, although other suitable means may be provided for applying these pressures.

From the foregoing description, it will be seen that the chassis structure for mounting transistors and like heat-sensitive devices, in accordance with the invention, may include a combined mounting-bracket or plate and heat-sink element or a plurality of such elements integrally connected. The construction provided is of relatively low manufacturing cost and effectively provides for (1) holding the device or devices in a fixed position and location on an apparatus chassis as a structural mounting means, (2) efficiently absorbing and dissipating the heat from the device as a heat-sink means, and (3) making good electrical as well as thermal contact with the device through mechanical gripping or clamping action on the casing or outer wall thereof. The electrical contact may be eliminated in certain applications by anodizing or other insulating film means having good thermal conduction.

The construction has a further advantage that it provides a combined mounting bracket or plate and heat-sink means into which transistor and like devices can quickly be clamped for testing operation, while providing good thermal and electrical contact in operation.

What is claimed is:

1. A chassis structure for mounting transistors and like heat-sensitive devices, comprising in combination:

a mounting plate having a free outer edge and a fixed inner edge with a flange therealong, means providing an opening in the plate for receiving and holding one of said devices therein with a relatively close fit, said plate being provided with a relatively narrow elongated slot extending from said free edge through said opening substantially at a right angle to the fixed edge of said plate to permit the opening to close and clamp said device in place, and means connected with said flange at spaced points thereon for applying a force to said fixed edge to produce a deforming pressure through said flange to the plate in the plane thereof and in a direction tending to close the slot and increase the clamping pressure on the device in the opening.

2. A chassis structure for mounting transistors and like heat-sensitive circuit components on an apparatus chassis, comprising in combination:

a combined mounting-plate and heat-sink element, means providing an opening in said element shaped to receive and grip one of said circuit components, said element being provided with an open slot extending from one edge thereof through said opening toward a second edge, means including spacing elements connected with said second edge of said first-named element at two spaced points to apply supporting pressure thereto from said chassis in one direction in the plane of said element, and means including a clamping element connected with said second edge intermediate between said two spaced points to apply fixed clamping pressure to said first-named element, in opposition to said supporting pressure in the plane thereof and tending to close the slot and clamp said component firmly in the opening and in close thermal contact with the outer surface thereof.

3. A chassis structure as defined in claim 2 wherein said spacing elements provide thermal and electrical insulation for said mounting-plate and heat-sink element from said apparatus chassis.

4. A chassis structure as defined in claim 2, wherein said spacing elements provide thermal and electrical insulation for said mounting-plate and heat-sink element from said apparatus chassis, and wherein said clamping element is electrically insulated from said mounting-plate and heat-sink element.

5. In an electronic apparatus chassis, a rapid-clamping and heat-sink means for apparatus components of the heat-generating type comprising, a plate element having a flanged edge connected at spaced points to the chassis and electrically and thermally insulated therefrom, an electrically-insulated clamping element extending through said flanged edge into connection with the chassis for applying a fixed clamping pressure to said edge between said spaced points, a mounting opening in said plate element having inner edges adapted for engaging and holding one of said apparatus components, and means providing an elongated slot extending through said opening from an opposite edge in the direction of and terminating short of said flanged edge, thereby to respond to said clamping pressure to releasably clamp said component in the mounting opening.

6. In an electronic apparatus chassis, a rapid-clamping and heat-sink means for apparatus components of the heat-generating type comprising, a plate element having a flanged edge connected at spaced points to the chassis and having a clamping element extending therethrough into connection with the chassis for applying a fixed clamping pressure thereto, a mounting opening in said plate element having inner edges adapted for engaging and holding one of said apparatus components, and means providing an elongated slot extending through said opening from an opposite edge in the direction of said flanged edge, thereby to respond to said clamping pressure to releasably clamp said component in the mounting opening.

7. A chassis structure for mounting transistors and like heat-sensitive devices comprising, in combination:

a mounting plate of heat-conducting material having a free edge and a fixed edge, means providing an opening in the plate between said edges shaped to receive and hold one of said devices with a relatively close fit, said plate being provided with a relatively-narrow slot extending from said free edge through said opening toward and short of the fixed edge of said plate, means providing two spaced support elements connected with said fixed edge of the plate to apply a supporting pressure thereto in one direction in the plane of the plate, and means connected with said fixed edge of the plate intermediate between said two support elements for applying pressure to said plate in opposition to said support elements in the plane of the plate, thereby to provide a deforming pressure in the plate tending to close the slot and clamp the device in the opening in close thermal contact with the outer surface thereof.

8. The combination with an electronic apparatus chassis, of structural mounting and heat-sink means for releasably holding transistors and like heat-sensitive circuit components and devices thereof in fixed positions and locations thereon, said mounting and heat-sink means including a plate element of heat-conducting material having at least one opening therein the inner edges of which are adapted to thermally contact the outer wall of a device therein for effective heat conduction from said device as a heat-sink therefor, said plate element having a slot extending from one edge towards a second edge, through said opening to permit said inner edges to move inwardly and clamp and hold said device, means for supporting and thermally insulating said plate element at spaced points on said second edge in connection with said chassis, and means connected with said chassis for applying pressure to said plate element in the plane thereof intermediate between said spaced points tending to close said slot and move said inner edges of said opening inwardly for increasing the clamping and holding pressure on said device.

9. The combination as defined in claim 8, wherein said element is provided with a flange along and substantially at a right-angle to said second edge thereof, and wherein the last-named means for applying pressure to said plate element includes a clamping element connected with an intermediate point on said flange and electrically insulated therefrom.

10. The combination as defined in claim 8, wherein a plurality of said plate elements are provided in said structural mounting and heat-sink means thereby to provide for mounting a plurality of transistor or like elements.

11. The combination as defined in claim 8, wherein at least one of the openings is provided with heat-conducting and electrical-insulating means.

12. A heat sink for transistors adapted to be mounted on a surface of a chassis comprising:

a flanged heat conducting member having a flange portion on one side thereof and an upstanding planar portion, an opening formed in said upstanding portion to thermally contact a transistor, a relatively narrow slot extending from an edge of said upstanding portion opposite said flange portion and passing through said opening;

means providing spaced support elements located between said flange portion and said chassis surface so that the flange portion is substantially parallel to said chassis surface, and with said upstanding portion extending in a plane substantially normal to said chassis surface, and clamping means connected between said chassis surface and a point on said flange portion intermediate said support elements for fastening said flanged heat conducting member to said chassis surface and to provide a deforming pressure through said flange portion to said upstanding portion in a direction tending to close said slot and clamp a transistor in said opening.

References Cited by the Examiner

UNITED STATES PATENTS

| | | | |
|---|---|---|---|
| 2,965,819 | 12/60 | Rosenbaum | 165—185 |
| 3,101,114 | 8/63 | Katz | 165—185 |

DARRELL L. CLAY, *Primary Examiner.*

JOHN F. BURNS, LARAMIE E. ASKIN, *Examiners.*